United States Patent [19]

Robinson et al.

[11] 4,201,579

[45] May 6, 1980

[54] METHOD FOR REMOVING PHOTORESIST BY HYDROGEN PLASMA

[75] Inventors: Frederick J. Robinson, Scottsdale; Clarence J. Tracy, Tempe, both of Ariz.

[73] Assignee: Motorola, Inc., Schaumburg, Ill.

[21] Appl. No.: 912,615

[22] Filed: Jun. 5, 1978

[51] Int. Cl.$^2$ ............................ G03C 5/00; C23F 1/02
[52] U.S. Cl. ............................... 430/323; 151/1; 156/626; 156/627; 156/643; 156/345; 156/646; 156/659.1; 315/111.2; 427/40; 427/41; 430/494
[58] Field of Search .............. 96/35.1, 36, 27 R, 36.2; 427/38, 40, 41; 156/646, 659, 626, 627, 643, 345; 204/192 E, 192 R; 134/2, 1; 315/111.2; 219/121 P; 118/50.1

[56] References Cited

U.S. PATENT DOCUMENTS

| | | | |
|---|---|---|---|
| 3,705,055 | 12/1972 | Christensen et al. | 156/646 X |
| 3,837,856 | 9/1974 | Irving et al. | 96/36.2 |
| 3,890,176 | 6/1975 | Bolon | 156/646 |
| 4,115,184 | 9/1978 | Poulsen | 156/646 X |
| 4,134,817 | 1/1978 | Bourdon | 156/643 X |
| 4,142,107 | 2/1979 | Hatzakis et al. | 96/36 X |

Primary Examiner—Edward C. Kimlin
Attorney, Agent, or Firm—John A. Fisher

[57] ABSTRACT

A method for removing photoresist from a substrate. A substrate to be stripped of photoresist is placed in a metal substrate holder or boat which is subsequently loaded into a plasma reactor. The holder is placed in contact with one electrode of the plasma reactor. The plasma reactor is evacuated and a hydrogen bearing gas is injected into the reactor at a rate to maintain the pressure between 0.1 and 10 Torr. The photoresist coated substrate is heated to a temperature between 100° C. and 225° C. Power is applied to the plasma reactor to create a hydrogen plasma which reacts with and removes the photoresist. During the removal operation the reflected power from the reactor is monitored to detect the end point of the plasma-photoresist reaction.

7 Claims, 5 Drawing Figures

U.S. Patent | May 6, 1980 | 4,201,579
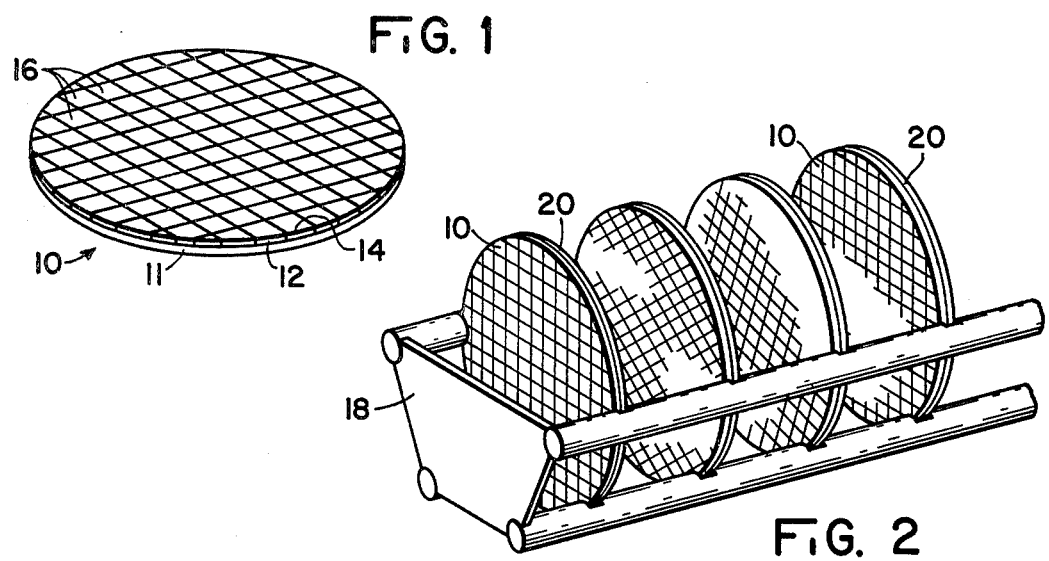
FIG. 1
FIG. 2
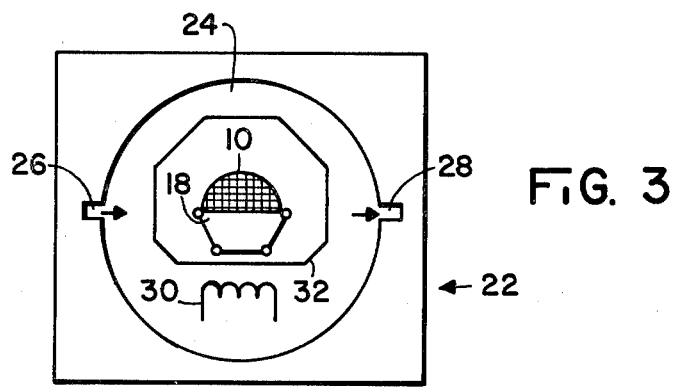
FIG. 3
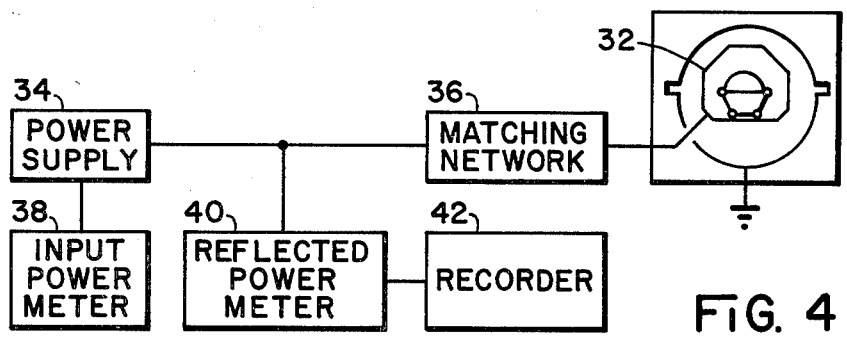
FIG. 4
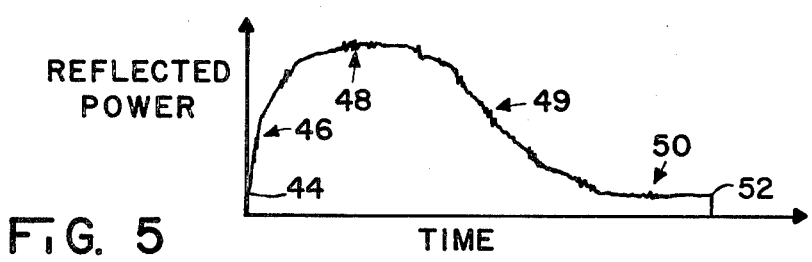
FIG. 5

METHOD FOR REMOVING PHOTORESIST BY HYDROGEN PLASMA

BACKGROUND OF THE INVENTION

This invention relates to a method for the plasma removal of photoresist. More specifically, this invention relates to a method for the removal of photoresist from an oxidizable substrate through the use of hydrogen plasma.

Patterned photoresist layers are often used as etch masks for etching a pattern in an underlying substrate. A photosensitive material is applied to the surface of a substrate and photolithographically patterned. The substrate coated with photoresist is then subjected to an etchant which etches those portions of the substrate which are exposed through the photoresist layer. The pattern in the photoresist layer is thus replicated in the substrate surface. After serving as an etch mask, the photoresist layer must be removed from the surface of the substrate. The photoresist layer, which is typically a polymerized organic film, can be removed by dissolution in an organic solvent. The photoresist layer can also be removed by a dry process known as "ashing". Ashing is a technique or process by which the photoresist layer is exposed to an oxygen plasma. The highly reactive oxygen plasma reacts with or oxidizes the organic photoresist layer. The oxidation or combustion products resulting from the ashing operation are volatile and are carried away in a gas stream. Ashing is preferred to wet chemical removal because fewer process steps are involved, less handling of the substrates is required, chemicals and chemical handling equipment are reduced, and ashing is more environmentally acceptable.

A major problem with the ashing process is that the highly reactive oxygen plasma can react in a deleterious manner with an oxidizable substrate material. Even using very dilute oxygen mixtures has not overcome this problem and does, at the same time, significantly slow the reaction. Ashing is thus limited to the removing of photoresist from nonoxidizable or only slowly oxidizable substrates.

Accordingly, it is an object of this invention to provide an improved dry photoresist stripping technique.

It is a further object of this invention to provide an environmentally acceptable photoresist removal process which does not adversely effect the underlying substrate.

SUMMARY OF THE INVENTION

In one embodiment of this invention a substrate from which a photoresist layer is to be removed is loaded into a plasma reactor. A hydrogen bearing gas is injected into the plasma reactor to fill the space surrounding the substrate and to maintain a pressure between about 0.2 and 1.5 Torr. The substrate coated with a photoresist material is heated. Radio frequency (RF) power is applied to the plasma reactor to create a hydrogen plasma which reacts with and removes the photoresist material. The power reflected back from the reactor to the power supply is monitored and the change in this reflected power is used as an end-point detector to determine the completion of the stripping operation.

BRIEF DESCRIPTION OF THE DRAWINGS

Others objects and advantages of the invention will become apparent upon reading the following detailed description taken in connection with the drawings, in which:

FIG. 1 is a perspective view showing a metallized semiconductor wafer from which a photoresist layer is to be stripped.

FIG. 2 is a perspective view showing a number of semiconductor wafers loaded in a plasma reactor boat.

FIG. 3 is a sectional view which schematically shows a plasma reactor in which the invention can be practiced.

FIG. 4 schematically shows the plasma reactor controls and the means for end point detection.

FIG. 5 is a typical recorder plot from an end-point detector.

DETAILED DESCRIPTION OF THE INVENTION

FIG. 1 shows a substrate 10 to be processed in accordance with the invention. The substrate comprises a semiconductor wafer 11 which is shown near the end of a typical process sequence. At this point the wafer may have undergone oxidations and diffusions, well known in the semiconductor art, by which transistors, diodes, resistors, and other active and passive devices are fabricated in the wafer. The wafer 11 can thus contain a plurality of discrete devices, integrated circuits, or the like. As one of the final steps in the processing of this wafer, a metal layer 12, such as silver is applied to the surface of the wafer 11 and is patterned to form device contacts and interconnects. The metal layer 12 can be patterned by applying a layer 14 of a photosensitive material over the metal. The photosensitive material 14 is patterned and processed to form an etch mask. The metal layer 12 is then etched in a suitable etchant causing the pattern in the photoresist layer 14 to be replicated in the underlying metal layer 12. For purposes of illustration, the metal pattern has simply been depicted as a series of rectangles 16. While this pattern might be suitable, for example, for an array of rectifiers, the pattern could be more or less complicated depending upon the type of device being fabricated. In some cases, for example, the pattern could involve a complex array of intricate interconnections. The photoresist layer 14 could be any of the typical photosensitive materials which are commonly used in the semiconductor field such as HR-100 made by the Philip A. Hunt Chemical Corporation or 747 made by the Eastman Kodak Company. After the photoresist layer has been used as an etch mask, it must be removed from the wafer 11 so that it does not interfere with any subsequent processing. If the wafer and the material underlying the photoresist layer are not easily susceptible to oxidation, this photoresist layer can be removed by ashing in an oxygen plasma. The photoresist layer cannot be removed in this manner, however, when the underlying material is easily oxidizable. The oxygen plasma will then oxidize the underlying layer, preventing, for example, adequate electrical connection. Examples of easily oxidizable layers are copper, silver, and the like. Even layered structures, such as a chromium, silver, gold sandwich structure can be adversely effected by the oxygen plasma. The silver has a tendency to migrate through the upper gold layer and that amount of silver which does migrate to the surface can be easily exodized.

The photoresist layer 14 can be removed, in accordance with the present invention, in a hydrogen plasma without any detrimental affects to underlying layers. A plurality of substrates 10 are loaded into a boat or holder 18 as shown in FIG. 2. The holder 18 is shown to be a typical four rail boat, but the exact form of the holder is not important to the practice of the invention. In a parallel plate reactor, for example, the substrates 10 might be placed directly on one of the parallel plates and the plate itself would then be the holder. It is necessary, however, that the holder be made of metal and that the substrates directly contact the holder. It has been found that the stripping action is slowed significantly if the substrates are electrically isolated from the boat. If the substrates themselves are covered with a layer of oxide or other insulator, the reaction can be enhanced by placing the substrate in contact with a second dummy silicon wafer or a metallic plate 20 which itself is in contact with the holder. To obtain a high rate of photoresist removal and to accommodate the maximum number of substrates in the holder, the spacing between substrates should be between about one-quarter inch and three-quarter inch with a spacing of about three-eights of an inch being optimum. Placing the substrates closer together than this results in a reduced removal rate while a greater spacing unduly limits the number of substrates that can be processed at one time.

FIG. 3 shows a plasma reactor which can be used in the practice of the invention. The reactor 22 has a reaction chamber 24 which can be sealed to control the ambient during the reaction. An inlet orifice 26 allows the injecting of specified gases into the reaction chamber 24. These gases include both reactant gases and inert gases such as nitrogen or argon which are used for purging and backfilling. An outlet orifice 28 which is attached to a vacuum pump (not shown) permits the extracting of reaction products from the chamber. By controlling the pumping speed of the vacuum pump and the flow of input gases the pressure within the chamber can be controlled. A heater 30 which has been shown as a simple resistance heater permits the controlled heating of substrates within the chamber. Within the reaction chamber 24 is an RF electrode 32 which is one of the electrodes used for the generation of the plasma. The substrate holder 18, filled with substrates 10 which are to be stripped of photoresist and with dummy wafers 20, is placed in the reaction chamber with the holder 18 in electrical contact with the electrode 32. Once the substrates have been loaded into the reaction chamber, the door of the plasma reactor 22 (not shown in this sectional view) is closed to seal the reaction chamber. It is important for the optimum practice of the invention that the plasma reactor have a heater element and also an internal RF electrode. The holder must contact the internal electrode.

In practicing the invention, a number of substrates are loaded into a holder and the holder is placed in the reaction chamber. The chamber is sealed, the vacuum pump evacuates the chamber, and a hydrogen bearing gas is injected through the inlet orifice 26. This gas can be, for example, pure hydrogen, forming gas (5 percent hydrogen in nitrogen) or other hydrogen gas mixtures. The pure hydrogen is preferred since it provides a much higher rate of photoresist removal. The rate at which the hydrogen bearing gas is injected into the reaction chamber and the pumping rate of the vacuum pump are adjusted to maintain the pressure within the reaction chamber between about 0.1 and 10.0 Torr. Preferably the range of pressure is maintained between 0.2 and 1.5 Torr with the optimum pressure being about 0.5 Torr. Higher or lower pressures are found to slow the reaction. The heater 30 is then used to heat the substrates to a temperature of about 100° to 225° C. and preferably to a temperature of about 100° C. to 150° C. The reaction rate is found to increase with temperature, but the upper temperature may be limited by the substrates involved. Some substrates can be adversely affected by higher temperatures. RF power is then applied to the reaction chamber to create a hydrogen plasma surrounding the substrates. The hydrogen plasma reacts with and removes the photoresist layer. The reaction products have been analyzed and are found to contain short chain volatile hydrocarbons of the form $CH_4$, $C_2H_6$, and the like. These reaction products are swept from the reaction chamber by the vacuum pump.

FIG. 4 schematically depicts the RF circuit for the plasma reactor. The power supply 34 is connected to the inner electrode 32 by a matching network 36. The input power from the power supply 34 is monitored on an input power meter 38. The input impedance looking into the reactor is a function of the load in the reaction chamber. Changing the substrate holder or the number of substrates being processed changes the impedance. To compensate for this variable imput impedance the matching network 36 is adjusted to minimize the reflected power as monitored on the reflected power meter 40. The reflected power can also be monitored and recorded on a strip chart recorder 42 which records the reflected power meter reading.

It is desirable to have a means for monitoring the reaction and for determining when the reaction has been carried to completion. End point detection improves the reproducibility of the stripping process, improves yield, and reduces process time. In conventional oxygen ashing an optical end point detector is employed and the reaction is monitored by a wide band optical detector. In the process of the present invention, however, no spectra has been found in the hydrogen plasma which allows optical detection. It has been found, however, that monitoring the reflected power provides reliable end point detection. The presence of reaction products in the reaction chamber changes the effective impedance, unbalances the network, and increases the reflected power. FIG. 5 shows a typical recorder tracing from recorder 42 showing the reflected power as a function of time. The reflected power is initially adjusted to a minimum value 44. As the stripping begins, the reflected power increases as shown at 46 as a result of detuning of the RF network and then peaks at a value as shown at 48. The reflected power declines 49 as the stripping progresses and then again drops to a low and constant value 50 when all of the photoresist has been removed and the reaction products evacuated from the chamber. The plasma reaction is allowed to continue for a short over etch time, say 2 minutes, to insure that all the photoresist has been removed. The power can then be shut off 52 and the substrates removed.

The following nonlimiting examples will serve to illustrate the practice of this invention and represents best modes contemplated by the inventors of the invention.

EXAMPLE I

Silicon wafers which had been processed to form semiconductor devices are metallized on one surface with sequential layers of chromium, silver, and gold. The upper most layer is then coated in the conventional manner with a film of photoresist to a thickness of about 10,000 Å. Following selective exposure and developing of the photoresist film, the metal layers are etched to a desired pattern using the photoresist as an etch mask. Six of the wafers are loaded into a stainless steel boat with a spacing of three-eights of an inch between wafers. The wafers are held in an upright position by the slots in the boat. Bare silicon wafers are placed in the boat slots so that a bare wafer is behind and in contact with each of the metallized wafers. The boat and wafers are loaded into a Tegal Model 421 plasma reactor which has been preheated to a temperature of about 150° C. The boat is placed in electrical contact with the inner electrode of the reactor. The door of the reactor is closed to seal the reaction chamber and the chamber is evacuated. Pure hydrogen gas is injected into the chamber. The flow rate of the hydrogen and the vacuum pumping are adjusted to maintain a pressure in the reactor of about 0.5 Torr. Power to the reactor is turned on and adjusted for a forward power of 300 watts and a reflected power of less than about 5 watts. The reflected power is recorded on a strip chart recorder. The reflected power first increases rapidly and then slowly decreases. After 23 minutes the reflected power has dropped to a minimum and no longer changes with time. The plasma reaction is allowed to continue for two minutes and then the power is turned off and the wafers removed from the reaction chamber. All of the photoresist has been removed from the wafers. The patterned metal layers show no signs of oxidation or other deterioration.

EXAMPLE II

The process of Example I is repeated except that 24 wafers are loaded into two boats and the two boats are placed in the reaction chamber. Bare silicon wafers are used to fill all empty slots in the boats. The reflected power is recorded to monitor the reaction. After 25 minutes the reflected power is still high indicating that the reaction is still continuing. After 60 minutes the reflected power has again dropped to a minimum and the wafers are found to be completely free of photoresist. This shows that the rate of the reaction is dependent on the number of wafers being processed.

EXAMPLE III

Six silicon wafers are thermally oxidized to a thickness of 10,000 Å. A 13,000 Å film of photoresist is applied to one surface of each wafer. The photoresist is exposed and developed in the conventional manner. The wafers are loaded into a metal boat with a three-eights inch spacing between wafers. The boat and wafers are placed in a plasma reactor and processed as in Example I. The reflected power meter does not show a change in reflected power. After 26 minutes the process is stopped and the wafers are inspected. No photoresist has been removed. Bare silicon wafers are placed in the boat behind and in contact with each of the photoresist coated wafers. The wafers are returned to the reactor and the process is repeated as in Example I. The reflected power is observed to increase rapidly, then decrease slowly to a minimum value. After 15 minutes the reaction is terminated and all wafers are observed to be free of photoresist. This shows that the wafers must be in good contact with the boat holder.

Thus it is apparent that there has been provided, in accordance with the invention, a process that fully satisfies the objects set forth above. While the invention has been described in conjunction with specific embodiments, it is evident that many alternatives and variations will be apparent to those skilled in the art in view of the foregoing description. The invention has been specifically described with respect to the removal of photoresist from semiconductor wafers, but it is not intended to be so limited. The invention can be utilized to remove either negative or positive photoresist from a variety of objects or substrates. Accordingly, it is intended to embrace all such alternatives and variations as fall within the spirit and scope of the following claims.

What is claimed is:

1. A method for removing a photoresist coating from a substrate which comprises the steps of: placing said substrate coated with said photoresist in a metal holder; placing said metal holder and said substrate in a plasma reactor, said metal holder in electrical contact with an electrode of said plasma reactor; heating said substrate; injecting a hydrogen bearing gas into said plasma reactor; applying power to said plasma reactor to create a plasma therein, a portion of said power being reflected from said reactor, said plasma reacting with and removing said photoresist from said substrate, and monitoring said reflected power from said reactor to detect the removing of the photoresist.

2. The method of claim 1 wherein said substrates are heated to a temperature between about 100° C. and about 225° C.

3. The method of claim 1 wherein said hydrogen bearing gas is substantially pure hydrogen.

4. The method of claim 1 wherein said hydrogen bearing gas is injected to maintain a pressure within said plasma reactor between about 0.1 and 10.0 Torr.

5. The method of claim 4 wherein said pressure is maintained at between about 0.2 and about 1.5 Torr.

6. A method for removing photoresist from a substrate which comprises the steps of: placing said substrate coated with photoresist in a metal substrate holder; placing said holder and said substrate in a plasma reactor, said holder contacting an electrode of said plasma reactor; evacuating said plasma reactor; injecting a hydrogen bearing gas into said plasma reactor to maintain a pressure in said reactor between 0.1 and 10.0 Torr; heating said substrate coated with photoresist to a temperature between about 100° C. and about 225° C.; applying power to said plasma reactor to create a hydrogen plasma therein, a portion of said power being reflected from said reactor, and said hydrogen plasma reacting with and removing said photoresist; and monitoring said reflected power from said reactor to detect the removing of said photoresist.

7. The method of claim 6 further comprising the step of terminating said reacting of said plasma with said photoresist in response to said monitoring of said reflected power.

* * * * *